US009534724B2

(12) United States Patent
Jiang et al.

(10) Patent No.: US 9,534,724 B2
(45) Date of Patent: Jan. 3, 2017

(54) GAS SHOWERHEAD, METHOD FOR MAKING THE SAME AND THIN FILM GROWTH REACTOR

(71) Applicant: Advanced Micro-Fabrication Equipment Inc, Shanghai, Shanghai (CN)

(72) Inventors: Yong Jiang, Shanghai (CN); Ning Zhou, Shanghai (CN); Henry Ho, Shanghai (CN); Zhiyou Du, Shanghai (CN)

(73) Assignee: ADVANCED MICRO-FABRICATION EQUIPMENT INC, SHANGHAI, Shanghai (CN)

( * ) Notice: Subject to any disclaimer, the term of this patent is extended or adjusted under 35 U.S.C. 154(b) by 488 days.

(21) Appl. No.: 13/891,138

(22) Filed: May 9, 2013

(65) Prior Publication Data
US 2013/0299009 A1  Nov. 14, 2013

(30) Foreign Application Priority Data

May 11, 2012  (CN) .......................... 2012 1 0147710

(51) Int. Cl.
*C23C 16/455* (2006.01)
*C30B 25/14* (2006.01)
(Continued)

(52) U.S. Cl.
CPC .......... *F16L 53/00* (2013.01); *C23C 16/45514* (2013.01); *C23C 16/45517* (2013.01);
(Continued)

(58) Field of Classification Search
None
See application file for complete search history.

(56) References Cited

U.S. PATENT DOCUMENTS 5,781,693 A    7/1998  Ballance
6,126,753 A *  10/2000  Shinriki ............... C23C 16/405
                                                        118/715
(Continued)

FOREIGN PATENT DOCUMENTS

CN        1664165 A      9/2005
CN     201618638 U      11/2010
(Continued)

OTHER PUBLICATIONS

Office Action in Japanese Patent Application No. 2013-098343 dated Sep. 29, 2014.
(Continued)

*Primary Examiner* — Parviz Hassanzadeh
*Assistant Examiner* — Stanislav Antolin
(74) *Attorney, Agent, or Firm* — Nixon Peabody LLP; Joseph Bach, Esq.

(57) ABSTRACT

The present application provides a gas showerhead including a gas distribution and diffusion plate and a water cooling plate, the gas distribution and diffusion plate includes several columns of first gas diffusion passages connecting to a first reactant gas source and several columns of second gas diffusion passages connecting to a second reactant gas source; the water cooling plate having cooling liquid passages is arranged below the gas distribution and diffusion plate, and the water cooling plate is provided with first gas outlet passages provided for the reactant gas in the first gas diffusion passages to flow out and second gas outlet passages provided for the reactant gas in the second gas diffusion passages to flow out, so as to isolatedly feed at least two reactant gases into a reaction chamber.

9 Claims, 11 Drawing Sheets

(51) Int. Cl.
*F16L 53/00* (2006.01)
*H01L 21/67* (2006.01)

(52) U.S. Cl.
CPC .. *C23C 16/45565* (2013.01); *C23C 16/45572* (2013.01); *C23C 16/45574* (2013.01); *C23C 16/45578* (2013.01); *C30B 25/14* (2013.01); *H01L 21/67109* (2013.01); *Y10T 137/0402* (2015.04); *Y10T 137/6416* (2015.04)

(56) References Cited

U.S. PATENT DOCUMENTS

| | | | | |
|---|---|---|---|---|
| 6,302,964 | B1* | 10/2001 | Umotoy | C23C 16/45514 118/715 |
| 7,156,921 | B2* | 1/2007 | Byun | B82Y 10/00 118/50 |
| 7,850,828 | B2* | 12/2010 | German | H01J 37/3244 204/192.12 |
| 2003/0077388 | A1* | 4/2003 | Byun | B82Y 10/00 427/255.28 |
| 2005/0092248 | A1* | 5/2005 | Lee | C23C 16/45565 118/715 |
| 2005/0217576 | A1* | 10/2005 | Ishibashi | C23C 16/452 118/715 |
| 2006/0021574 | A1* | 2/2006 | Armour | C23C 16/45565 118/715 |
| 2006/0270220 | A1* | 11/2006 | Saitoh | H01J 37/3244 438/680 |
| 2008/0067057 | A1* | 3/2008 | German | H01J 37/3244 204/192.1 |
| 2008/0099147 | A1* | 5/2008 | Myo | C23C 16/45565 156/345.34 |
| 2008/0173735 | A1* | 7/2008 | Mitrovic | C23C 16/45574 239/548 |
| 2008/0236495 | A1* | 10/2008 | Tompa | C23C 16/45565 118/724 |
| 2009/0098276 | A1* | 4/2009 | Burrows | C23C 16/45565 427/8 |
| 2009/0104351 | A1* | 4/2009 | Kakegawa | C23C 16/34 427/248.1 |
| 2009/0169744 | A1* | 7/2009 | Byun | C23C 16/40 427/255.28 |
| 2010/0143588 | A1* | 6/2010 | Belousov | C23C 16/45574 427/255.28 |
| 2010/0170438 | A1* | 7/2010 | Saywell | B23K 20/023 118/715 |
| 2011/0048325 | A1* | 3/2011 | Choi | C23C 16/452 118/712 |
| 2012/0024478 | A1 | 2/2012 | Huang et al. | |
| 2013/0174783 | A1* | 7/2013 | Suzuki | C23C 16/45565 118/725 |
| 2013/0299009 | A1* | 11/2013 | Jiang | F16L 53/00 137/334 |

FOREIGN PATENT DOCUMENTS

| | | | |
|---|---|---|---|
| CN | 201933153 U | 8/2011 | |
| CN | 202090055 U | 12/2011 | |
| JP | 02-071511 A | 3/1990 | |
| JP | 11-080959 A | 3/1999 | |
| JP | 2002-155366 A | 5/2002 | |
| JP | 2009-152434 A | 7/2009 | |
| JP | 2010-503768 A | 2/2010 | |
| JP | 2010-508660 A | 3/2010 | |
| JP | WO 2012008440 A1 * | 1/2012 | ....... C23C 16/45565 |
| KR | 2001-0072001 A | 7/2001 | |
| KR | 1020080025277 | 8/2008 | |
| KR | 10-2011-0124935 A | 11/2011 | |
| WO | 2008/032910 A1 | 3/2008 | |
| WO | 2008/051717 A1 | 5/2008 | |

OTHER PUBLICATIONS

Office Action in Korean Patent Application No. 10-2013-0048384 dated Nov. 7, 2014.
Office Action in Korean Patent Application No. 10-2013-0048384 dated Jun. 27, 2014.

* cited by examiner

GAS SHOWERHEAD, METHOD FOR MAKING THE SAME AND THIN FILM GROWTH REACTOR

The present application claims the benefit of Chinese Patent Application No. 201210147710.8 titled "GAS SHOWERHEAD, METHOD FOR MAKING THE SAME AND THIN FILM GROWTH REACTOR" and filed with the Chinese State Intellectual Property Office on May 11, 2012, the entire disclosure of which is incorporated herein by reference.

FIELD OF THE INVENTION

The present application relates to the technical field of feeding gas into a reaction chamber, in particular to a device for uniformly feeding reactant gases into a reaction chamber to be mixed.

BACKGROUND OF THE INVENTION

Currently, various reaction chambers have been used in making semiconductor devices, flat plate cell and solar cell or the like, for example, Chemical Vapor Deposition (CVD), Plasma Enhanced Chemical Vapor Deposition (PECVD), Metal Organic Chemical Vapor Deposition (MOCVD), Vapor Phase Epitaxy growth (VPE). In practical application, the flow velocity of the reactant gases entering in the reaction chamber can not be too high, and the reactant gases can not be mixed before entering the reaction chamber, meanwhile the reactant gas entering the reaction chamber should be as uniform as possible, thus accordingly, various designs for the showerhead are provided to ensure the reactant gas meeting the above requirements before entering the reaction chamber. In addition, effective cooling of the showerhead may also facilitate the reacting effect, thus in many applications, fluids including water are used for cooling.

However, in the prior art, those devices have complex designs, and the gas entering the reaction chamber does not have sufficient uniformity. Two or more reactant gases have to be isolated from each other before entering the reaction chamber, which requires the showerhead to be designed to have a plurality of layer plates and complicated tubing structure. Furthermore, the cooling system must be capable of preventing the rising of the temperature effectively so as to prevent any leakages, which results in the complex design and increased manufacturing cost of the showerhead. Most importantly, in order to ensure the workpieces to be processed are processed uniformly in the reaction chamber, the reactant gases are required to be fed into the reaction chamber uniformly, thus, there is a need to provide a showerhead having simple structure and low manufacturing cost, while ensuring that a plurality of reactant gases are isolated from each other, a cooling system is provided, and the gases are fed uniformly.

SUMMARY OF THE INVENTION

The present application provides a gas showerhead so as to solve technical problems of uniformity of the reactant gas entering the reaction chamber, leakage of the cooling liquid, and the deposition is liable to be generated on the surface of the showerhead by the reactant gases.

For realizing the object of the present application, a gas showerhead, for isolatedly feeding at least a first reactant gas and a second reactant gas into a plasma reaction chamber, is provided, which includes:

a gas distribution and diffusion plate, including a plurality of columns of first gas diffusion passages connecting to a first reactant gas source and a plurality of columns of second gas diffusion passages connecting to a second reactant gas source, and the plurality of columns of the first gas diffusion passages and the plurality of columns of the second gas diffusion passages are arranged alternately, and each column of the first gas diffusion passages and each column of the second gas diffusion passages both include a plurality of separated gas diffusion paths; and a water cooling plate, located below the gas distribution and diffusion plate, including a plurality of columns of cooling liquid passages, a plurality of first gas outlet passages provided for a reactant gas in the first gas diffusion passages to flow out, and a plurality of second gas outlet passages provided for a reactant gas in the second gas diffusion passages to flow out;

wherein, the gas distribution and diffusion plate and the water cooling plate are two separated components and are assembled integrally in a detachable mechanical manner, and the first reactant gas and the second reactant gas are isolated from each other before escaping from the gas showerhead and entering the reaction chamber.

The gas distribution and diffusion plate includes an upper plate and a lower plate, the first gas diffusion passages are a plurality of columns of first conduits extending through the upper plate and the lower plate, and the second gas diffusion passages are a plurality of columns of second conduits extending through the lower plate; an upper conduit opening of the second conduit is lower than a lower surface of the upper plate, and an upper conduit opening of the first conduit is higher than or flush with an upper surface of the upper plate.

Further, the gas distribution and diffusion plate includes an upper plate and a lower plate, the first gas diffusion passages are a plurality of columns of conduits extending through the upper plate and the lower plate, and the second gas diffusion passages are a plurality of columns of holes extending through the lower plate.

Further, the gas distribution and diffusion plate includes an upper plate and a lower plate, the first gas diffusion passages are a plurality of columns of conduits extending through the upper plate and the lower plate, a plurality of columns of bosses are uniformly distributed on the lower plate, an upper surface of the boss is higher than an upper surface of the lower plate, and the second gas diffusion passages are a plurality of columns of holes extending through the bosses and the lower plate.

Areas where the conduits contact the upper plate and the lower plate are seal welded.

Further, the gas distribution and diffusion passage is a flat plate having a certain thickness, the first gas diffusion passages are a plurality of separated first drill holes extending through upper and lower surfaces of the flat plate, a plurality of columns of gas passages substantially parallel to the upper and lower surfaces of the flat plate are arranged inside the flat plate, and the second gas diffusion passages are a plurality of separated second drill holes extending through a lower surface of the flat plate from the gas passages.

Further, the water cooling plate is a flat plate having a certain thickness and includes an upper surface and a lower surface, each of the first gas outlet passage and the second gas outlet passage is a longitudinal groove extending through upper and lower surfaces of the water cooling plate, and the cooling liquid passage is between the first gas outlet passage and the second gas outlet passage.

Further, the water cooling plate is a flat plate having a certain thickness and includes an upper surface and a lower surface, the first gas outlet passage and the second gas outlet passage each comprises a hole having a certain depth and extending through the upper surface of the water cooling plate, and a longitudinal groove extending through the lower surface and communicated with the hole, and the cooling liquid passage is between the first gas outlet passage and the second gas outlet passage.

Further, the first gas outlet passages constitute first loop structures, each of which is intercommunicated, on a lower surface of the water cooling plate, and the second gas outlet passages constitute second loop structures, each of which is intercommunicated, on the lower surface of the water cooling plate, and the first loop structures and the second loop structures are arranged alternately, or nested within each other.

Further, the first loop structure and the second loop structure both are of a regular polygonal structure or a circular structure.

Further, the water cooling plate further includes a plurality of columns of holes extending downwards by a certain depth from an upper surface of the water cooling plate, and the plurality of holes communicate with the first loop structures and the second loop structures correspondingly.

A cross sectional area at one end, close to workpieces to be processed, of the first gas outlet passage of the water cooling plate gradually increases as getting close to the workpieces to be processed.

A cross sectional area at one end, close to workpieces to be processed, of the second gas outlet passage of the water cooling plate gradually increases as getting close to the workpieces to be processed.

The first gas outlet passage and the second gas outlet passage are corresponding to positions of outlets of the first gas diffusion passage and the second gas diffusion passage respectively.

A plurality of gas buffering openings are selectively arranged on the water cooling plate, the plurality of gas buffering openings communicate with at least part of the plurality of the first gas outlet passages correspondingly or at least part of the plurality of the second gas outlet passages correspondingly.

The gas buffering opening is of a stepped shape, or a slope shape, or a circular arc shape.

The gas buffering opening of stepped shape may have one step or a plurality of steps, and the step close to the gas distribution and diffusion plate is located at a position corresponding to an outlet of the first gas diffusion passage or an outlet of the second gas diffusion passage.

Further, the gas distribution and diffusion plate includes a first distribution zone and a second distribution zone, the first distribution zone is close to a gas inlet of a reactant gas source, and a distance between the second distribution zone and the gas inlet of the reactant gas source is larger than a distance between the first distribution zone and the gas inlet of the reactant gas source; an inner diameter of the first gas diffusion passage in the first distribution zone is smaller than an inner diameter of the corresponding first gas diffusion passage in the second distribution zone, and an inner diameter of the second gas diffusion passage in the first distribution zone is smaller than an inner diameter of the corresponding second gas diffusion passage in the second distribution zone.

Further, the first gas diffusion passages have the same length, and the second gas diffusion passages also have the same length.

The gas showerhead includes two parts, i.e., the gas distribution and diffusion plate and the water cooling plate, the two parts are assembled integrally in a detachable mechanical manner, such that the manufacture is simple and the two parts can be detached for cleaning individually.

Further, the present application further provides a thin film growth reactor including a reaction chamber, and a supporting member and workpieces to be processed provided on the supporting member are provided in the reaction chamber, and the supporting member is rotatable in a substantially horizontal direction, and one of the above-described gas showerhead is arranged above the supporting member.

The present application further provides a method for making the gas showerhead, including the following steps:

a step for making a gas distribution and diffusion plate: arranging a plurality of columns of first gas diffusion passages connecting to a first reactant gas source and a plurality of columns of second gas diffusion passages connecting to a second reactant gas source on a first plate body, wherein the plurality of columns of the first gas diffusion passages and the plurality of columns of the second gas diffusion passages are arranged alternately, and each column of the first gas diffusion passages and each column of the second gas diffusion passages both include a plurality of separated gas diffusion paths;

a step for making the water cooling plate: arranging, on a second plate body, a plurality of columns of cooling liquid passages, a plurality of first gas outlet passages provided for a reactant gas in the first gas diffusion passages to flow out, and a plurality of second gas outlet passages provided for a reactant gas in the second gas diffusion passages to flow out;

a step for assembling: assembling the gas distribution and diffusion plate and the water cooling plate in a detachable mechanical manner, enabling the plurality of columns of the first gas diffusion passages to be communicated with the first gas outlet passages, and enabling the plurality of columns of the second gas diffusion passages to be communicated with the second gas outlet passages.

Further, the step for making the gas distribution and diffusion plate includes:

making an upper plate, and drilling a first group of a plurality of holes on the upper plate;

making a lower plate and arranging a plurality of columns of bosses regularly on the lower plate, with an upper surface of the boss being higher than an upper surface of the lower plate; drilling a second group of a plurality of holes in the lower plate, and a position of each hole in the second group of holes is corresponding to a position of each hole in the first group of holes; inserting a corresponding number of conduits into the first group of holes in the upper plate and the second group of holes in the lower plate; and drilling a third group of a plurality of holes in the bosses, wherein the second group of a plurality of holes and the third group of a plurality of holes both are arranged by columns, and columns of the second group of holes and columns of the third group of holes are arranged uniformly and alternately.

Further, the step for making the water cooling plate includes:

making a flat plate having a certain thickness, arranging a plurality of columns of cooling liquid passages substantially parallel to upper and lower surfaces of the flat plate inside the flat plate uniformly, arranging a longitudinal gas outlet groove between each two adjacent cooling liquid passages, and wherein two columns of the gas outlet grooves are respectively corresponding to the second group of holes and the third group of holes of the gas distribution and diffusion plate.

The gas showerhead according to the present application has the following advantages. In the present application, a gas distribution and diffusion plate is arranged above a water cooling plate, so as to isolatedly distribute at least two kinds of reactant gases in gas outlet passages of the water cooling plate uniformly, and realize the uniform distribution of the gas in the central zone and the edge zone in the reaction chamber, thereby improving the utilization efficiency of the reactant gas and the qualified rate of the workpieces to be processed. In the present application, the gas diffusion plate and the water cooling plate are made separately, such that the difficulty of the manufacture is reduced, and the reactant gases can be diffused in the state of being isolated from each other, meanwhile the leakage of the cooling liquid in the cooling liquid passage can be prevented. Further, the gas distribution and diffusion plate and the water cooling plate are assembled in a detachable mechanical manner, such that the gas distribution and diffusion plate and the water cooling plate can be cleaned or replaced independently, thereby reducing the cost and improving the efficiency.

BRIEF DESCRIPTION OF THE DRAWINGS

Other features, objects and advantages of the present application will become more apparent from the following detailed description of non-limiting embodiments made with references to the accompanying drawings.

The following accompanying drawings form a part of the present specification, and describe various embodiments in conjunction with other parts of the specification to explain and illustrate the principle of the present application. The following accompanying drawings do not depict all the technical features of the specific embodiments, and do not depict the components in full size or actual proportion.

DETAILED DESCRIPTION OF THE INVENTION

Figure 1:
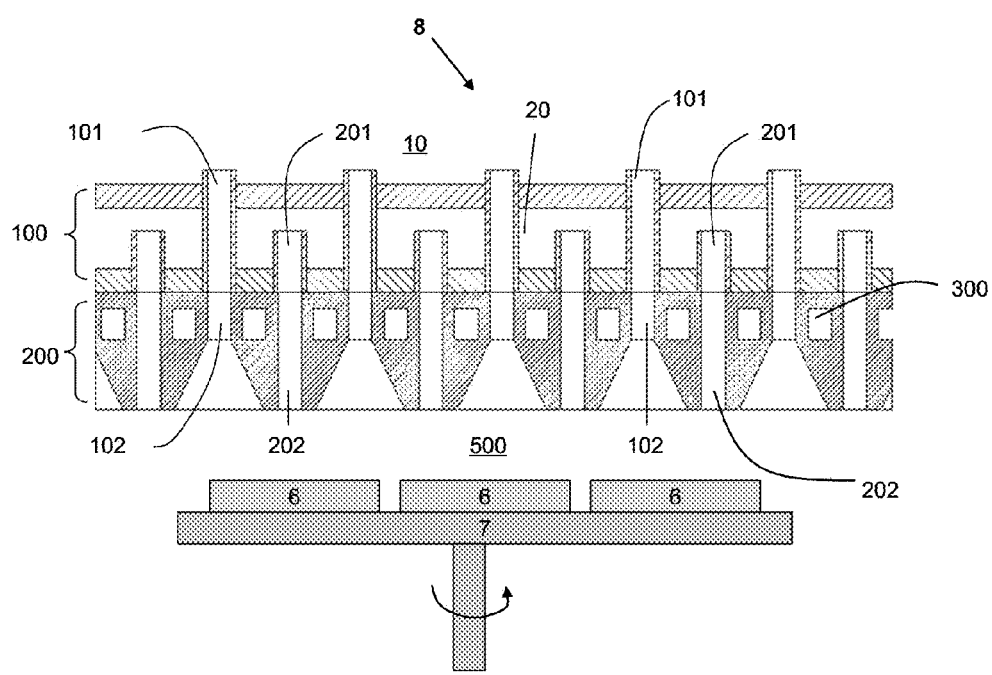
FIG. 1 is a schematic view showing the structure of a thin film growth reactor according to the present application.

FIG. 1 is a schematic view showing the structure of a thin film growth reactor according to the present application. As shown in FIG. 1, the present application provides a thin film growth reactor including a reaction chamber 8. A supporting member 7 and workpieces 6 to be processed provided on the supporting member 7 are arranged in the reaction chamber 8. The supporting member 7 is rotatable in a substantially horizontal direction, and a gas showerhead is arranged above the supporting member 7 so as to isolatedly distribute and diffuse various reactant gases into a reaction zone 500 to be mixed uniformly. The gas showerhead includes a gas distribution and diffusion plate 100 and a water cooling plate 200 located below the gas distribution and diffusion plate. The gas distribution and diffusion plate 100 and the water cooling plate 200 are two separated components which may be assembled integrally in a detachable mechanical manner and may be disassembled for cleaning or replacing with new components. The thin film growth reactor according to the present application may be adapted to various kinds of chemical vapor deposition reactions, and also may be adapted to thin film epitaxy growth technology, such as hydrid vapor-phase epitaxy, metal organic chemical vapor deposition.

Figure 2:
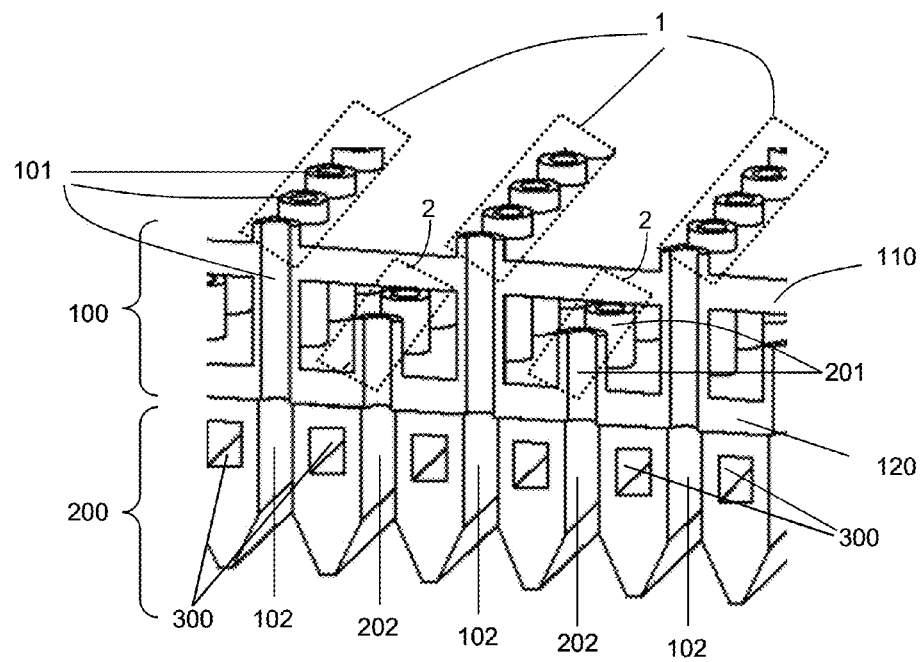
FIG. 2 is a sectional schematic view showing the three-dimensional structure of a gas showerhead according to the present application.

FIG. 2 is a sectional schematic view showing the three-dimensional structure of the gas showerhead shown in FIG. 1, and the arrangement structure of the gas distribution and diffusion plate 100 and the water cooling plate 200 is further shown in FIG. 2. The gas distribution and diffusion plate 100 is arranged above the water cooling plate 200. The gas distribution and diffusion plate 100 includes several columns of first gas diffusion passages 1 connecting to a first reactant gas source (not shown) and several columns of second gas diffusion passages 2 connecting to a second reactant gas source (not shown). The several columns of the first gas diffusion passages 1 and the several columns of the second gas diffusion passages 2 are arranged alternately. Each column of the first gas diffusion passages 1 and each column of the second gas diffusion passage 2 include several separated gas diffusion paths (which will be described in detail hereinafter). The water cooling plate 200 includes several columns of cooling liquid passages 300, a first gas outlet passage 102 provided for the reactant gas in the first gas diffusion passages 1 to flow out, and a second gas outlet passage 202 provided for the reactant gas in the second gas diffusion passages 2 to flow out.

Figure 3A:
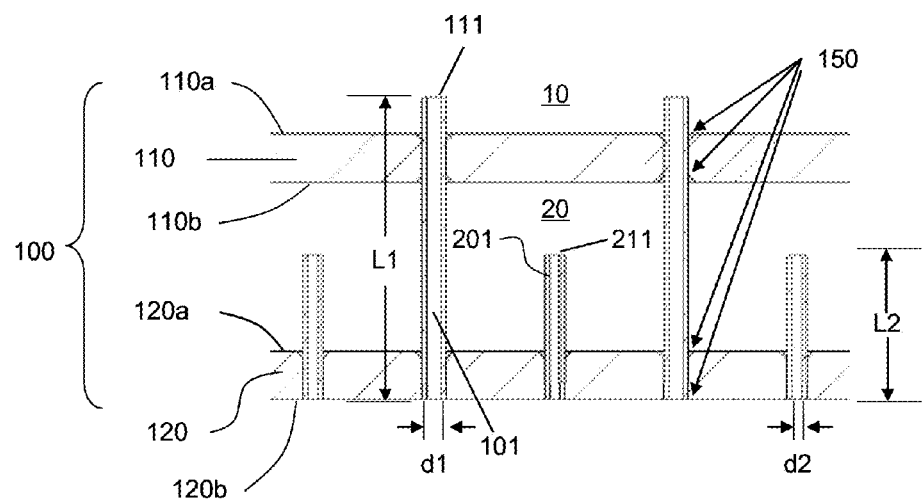
FIG. 3A is a schematic view showing the structure of one embodiment of a gas distribution and diffusion plate according to the present application.
Figure 3B:
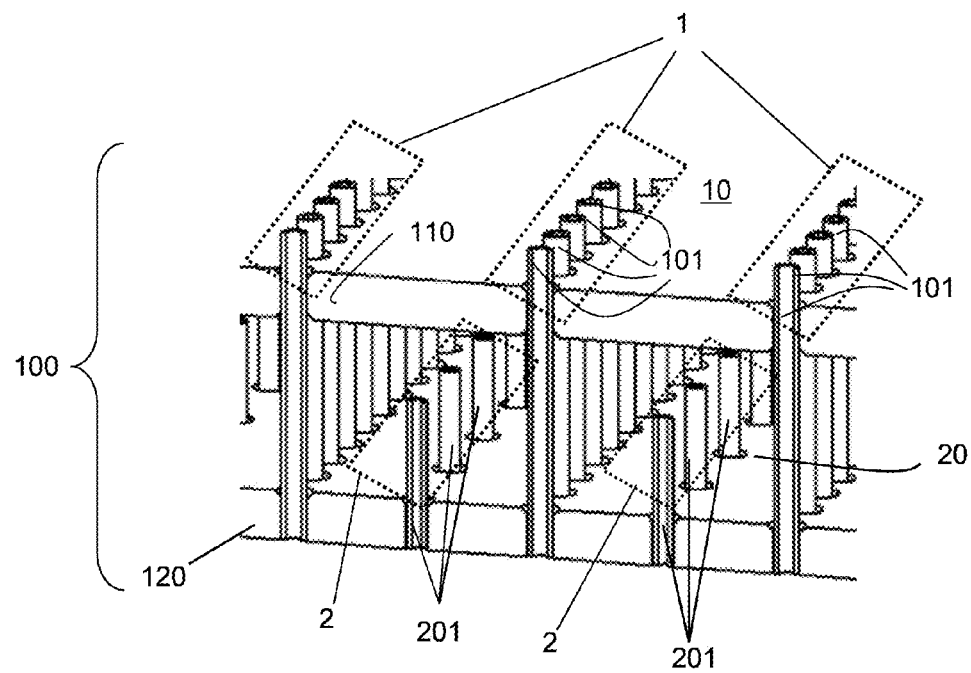
FIG. 3B is a sectional schematic view showing the three-dimensional structure of the gas distribution and diffusion plate shown in FIG. 3A.

FIG. 3A is a schematic view showing the structure of one embodiment of the gas distribution and diffusion plate according to the present application, and FIG. 3B is a sectional schematic view showing the three-dimensional structure of the gas distribution and diffusion plate shown in FIG. 3A. As shown in the figures, the gas distribution and diffusion plate 100 includes several columns of first gas diffusion passages 1 connecting to a first reactant gas zone 10 and several columns of second gas diffusion passages 2 connecting to a second reactant gas zone 20. The several columns of the first gas diffusion passages 1 and the several columns of the second gas diffusion passages 2 are arranged alternately. Each column of the first gas diffusion passages 1 and each column of the second gas diffusion passages 2 include several separated gas diffusion paths. In the embodiment shown in the figures, these separated gas diffusion paths consist of several gas conduits 101, 201 arranged independently. In each column of the first gas diffusion passages 1 and each column of the second gas diffusion passages 2, a cross section of a conduit opening of each of the separated conduits in a horizontal direction may be circular, elliptic, square, triangular, or in one of irregular shapes. In the present application, the cross sections of the conduit openings of these conduits in the horizontal direction are circular.

In the embodiment described in FIG. 3A and FIG. 3B, the gas distribution and diffusion plate 100 includes an upper plate 110 and a lower plate 120, the upper plate 110 includes an upper surface 110a and a lower surface 110b, the lower plate 120 includes an upper surface 120a and a lower surface 120b. Each column of the first gas diffusion passages 1 includes several conduits 101 extending through both the upper plate 110 and the lower plate 120, and each column of the second gas diffusion passages 2 includes several conduits 201 extending through the lower plate 120. An upper conduit opening 211 of the conduit 201 is lower than the lower surface 110b of the upper plate 110. The areas at which the conduit 101 of the first gas diffusion passage 1 contacts the upper plate 110 and the lower plate 120 are seal welded so as to prevent the gas in the first reactant gas zone 10 and the gas in the second reactant gas zone 20 from being mixed and reacted with each other, and welding spots of the contact area are shown by reference numeral 150. For facilitating the welding, and for ensuring that the first reactant gas can be diffused and distributed uniformly, an upper conduit opening 111 of the conduit 101 of the first gas diffusion passage 1 is higher than the upper surface 110a of the upper plate 110, and it may also be flush with the upper surface 110a.

After the gases in the first gas zone 10 and the second gas zone 20 are conveyed into the reaction zone 500 via the gas distribution and diffusion plate 100 and the water cooling plate 200, pressures of the gases drop, and the gas pressure drop has a certain proportional relationship with a cross sectional area of the conduit opening and a length of the conduit in the first gas diffusion passage 1 and the second gas diffusion passage 2, and the proportional relationship is that $\Delta P$ is directly proportional to $L/d^3$. Parameter $\Delta P$ is the pressure drop of the gas in the first gas zone 10 or the second gas zone 20 after passing through the gas showerhead and entering the reaction zone 500, and parameter L is the length of the conduit in the first gas diffusion passage 1 or the second gas diffusion passage 2. In order to achieve the best gas diffusing effect, the length L of the conduit in the first gas diffusion passage 1 is ranged from 20 mm to 50 mm, and the length L of the conduit in the second gas diffusion passage 2 is ranged from 2 mm to 19 mm. Parameter d is an inner diameter of the conduit in the first gas diffusion passage 1 and the second gas diffusion passage 2, and parameter d is ranged from 0.5 mm to 5 mm. Preferably, in order to ensure that the reactant gas entering the reaction chamber has a uniform concentration, in the present application, each conduit of the first gas diffusion passage 1 has a length L1 of 30 mm and an inner diameter d1 of 2.5 mm; and each conduit of the second gas diffusion passage 2 has a length L2 of 15 mm and an inner diameter d2 of 2.5 mm, wherein the length L2 of the conduit in the second gas diffusion passage 2 is greater than a thickness of the lower plate 120. During practical implementations, L1 is greater than L2, and d1 can be equal or unequal to d2.

It should be appreciated that, the several separated gas diffusion paths in each column of the first gas diffusion passages 1 and each column of the second gas diffusion passages 2 may be implemented in other ways. For example, the several separated gas diffusion paths may be drilled holes having a certain thickness, deep holes having a certain depth or passage structures having a hole-like shape. These drilled holes or deep holes or passage structures may be arranged on a plate body having a certain thickness. The above implementing ways are described in detail hereinafter.

Figure 4:
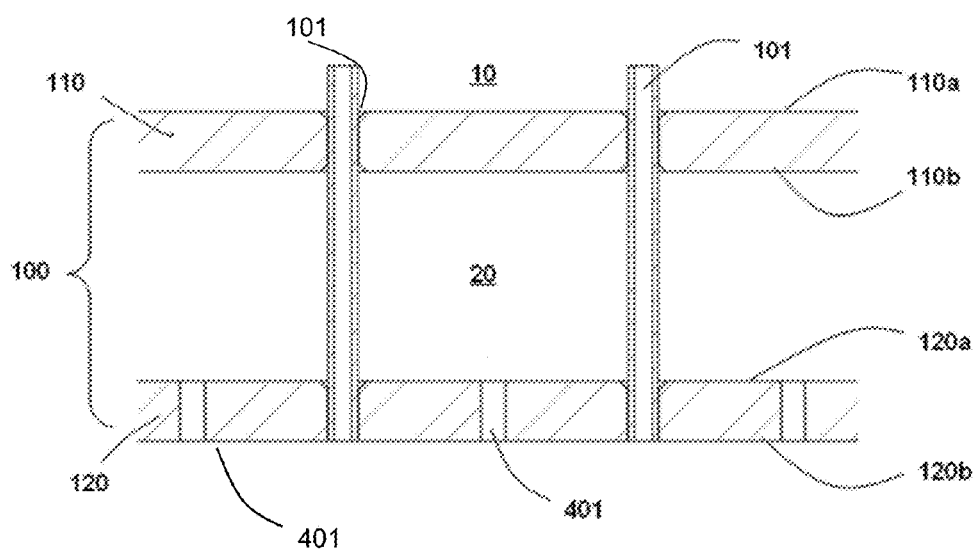
FIG. 4 is a schematic view showing the structure of another embodiment of the gas distribution and diffusion plate.

FIG. 4 is a schematic view showing the structure of another embodiment of the gas distribution and diffusion plate. As shown in FIG. 4, the second gas diffusion passage 2 includes several columns of holes 401 extending through the lower plate 120, these holes 401 constitute several separated gas diffusion paths, and the second gas in the second gas zone 20 is conveyed into corresponding gas outlet passages in the water cooling plate 200 via the holes 401. While, the several separated gas diffusion paths of the first gas diffusion passages 1 are still constituted by several conduits 101.

Figure 5:
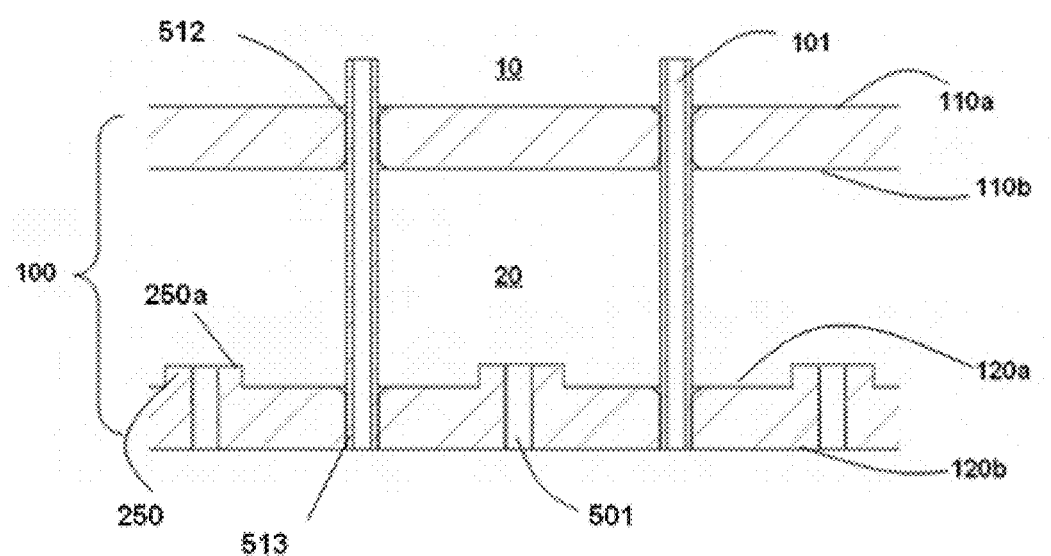
FIG. 5 is a schematic view showing the structure of yet another embodiment of the gas distribution and diffusion plate.

FIG. 5 is a schematic view showing the structure of yet another embodiment of the gas distribution and diffusion plate. As shown in FIG. 5, several columns of bosses 250 are regularly arranged on the lower plate 120 of the gas distribution and diffusion plate 100, and an upper surface 250a of the boss 250 is higher than the upper surface 120a of the lower plate 120. The bosses 250 may be columns of continuous protruding plates or may be columns of discontinuous protrusions. The second gas diffusion passage 2 includes several columns of holes 501 extending through the bosses 250 and the lower plate 120, these holes 501 constitute several separated gas diffusion paths, And the second gas in the second gas zone 20 is conveyed into the water cooling plate 200 via the holes 501. While the several separated gas diffusion paths of the first gas diffusion passages 1 are still constituted by several conduits 101.

A method for making the gas distribution and diffusion plate 100 in the embodiment shown in FIG. 5 includes the following steps: making an upper plate 110 and drilling a first group of multiple holes 512 in the upper plate 110; making a lower plate 120 and arranging several columns of bosses 250 regularly on the lower plate 120, with an upper surface 250a of the boss 250 being higher than an upper surface 120a of the lower plate 120; drilling a second group of multiple holes 513 in the lower plate 120, and the position of each hole 513 in the second group of holes is corresponding to the position of each hole 512 in the first group of holes in the vertical direction; inserting a corresponding number of conduits 101 into the first group of holes 512 in the upper plate 110 and the second group of holes 513 in the lower plate 120; and drilling a third group of multiple holes 501 in the bosses 250, wherein the hole 501 in the third group of multiple holes extend through both the boss 250 and the lower plate 120, and the second group of holes 513 and the third group of holes 501 both are arranged by columns, and columns of the second group of holes 513 and columns of the third group of holes 501 are arranged uniformly and alternately on the lower surface 120*b* of the lower plate 120.

Figure 6:
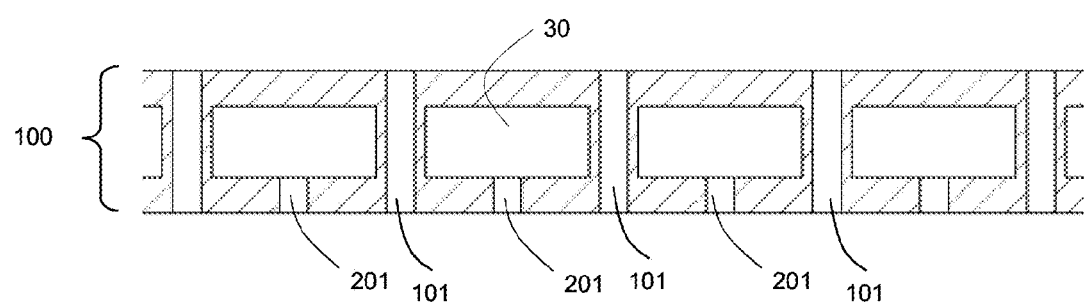
FIG. 6 is a schematic view showing the structure of still another embodiment of the gas distribution and diffusion plate.

FIG. 6 is a schematic view showing the structure of still another embodiment of the gas distribution and diffusion plate. As shown in FIG. 6, the gas distribution and diffusion plate 100 is a flat plate having a certain thickness. Several columns of gas passages 30 substantially parallel to upper and lower surfaces of the flat plate are arranged uniformly inside the flat plate 100. A second reactant gas is distributed in the gas passages 30. The second gas diffusion passages 2 includes drill holes 201 extending from the gas passage 30 through the lower surface 110*a* of the flat plate. The first gas diffusion passage 1 includes drill holes 101 extending through the upper and lower surfaces of the gas distribution and diffusion plate 100. The first gas diffusion passages and the second gas diffusion passages are arranged by columns, and columns of the first gas diffusion passages and columns of the second gas diffusion passages are arranged alternatively. The drill holes 101 and the drill holes 201 constitute the above-described several separated gas diffusion paths.

Figure 7A:
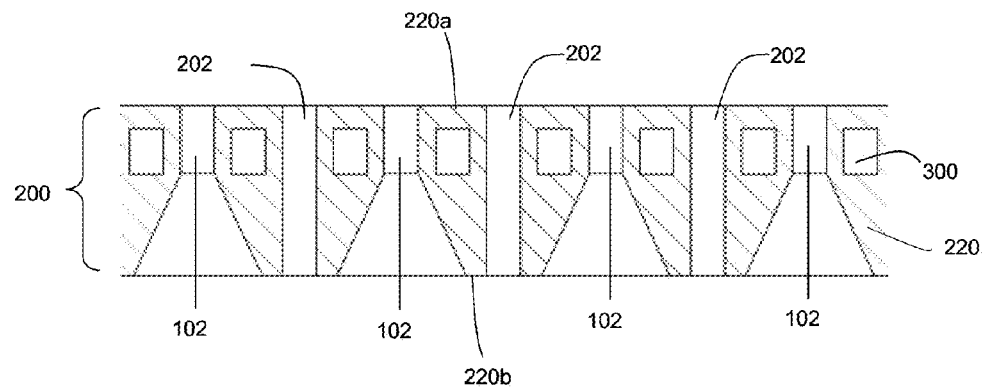
FIG. 7A is a schematic view showing the structure of one embodiment of a water cooling plate according to the present application.
Figure 7B:
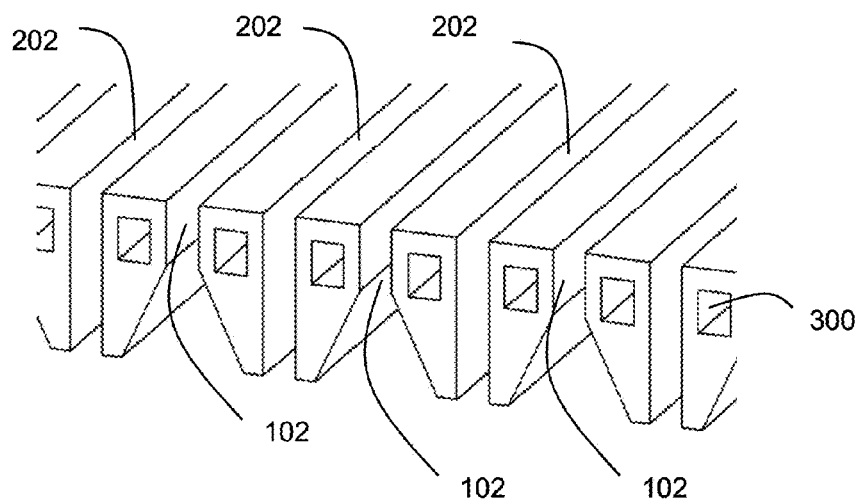
FIG. 7B is a sectional schematic view showing the three-dimensional structure of the water cooling plate shown in FIG. 7A.

FIGS. 7A and 7B are schematic views showing the structure of the water cooling plate. The water cooling plate 200 includes a flat plate 220 having a certain thickness. Several columns of cooling liquid passages 300 substantially parallel to upper and lower surfaces of the flat plate 220 are arranged inside the flat plate 220. A longitudinal first gas outlet groove 102 provided for the reactant gas in the first gas diffusion passage 1 to flow out and a longitudinal second gas outlet groove 202 provided for the reactant gas in the second gas diffusion passage 2 to flow out are arranged at two sides of each of the cooling liquid passages 300 respectively. The first gas outlet grooves 102 and the second gas outlet grooves 202 are alternately arranged. The longitudinal first gas outlet groove and the longitudinal second gas outlet groove may be of a continuous structure or of a discontinuous structure. The first gas diffusion passages 1 and the first gas outlet grooves 102 are correspondingly communicated in the vertical direction, and the second gas diffusion passages 2 and the second gas outlet grooves 202 are correspondingly communicated in the vertical direction. The first gas diffusion passages 1 and the first gas outlet grooves 102 are correspondingly intercommunicated to form first reactant gas passages, the second gas diffusion passages 2 and the second gas outlet grooves 202 are correspondingly intercommunicated to form second reactant gas passages, and the first reactant gas passages and the second reactant gas passages are arranged alternately and are isolated from each other.

Figure 8:
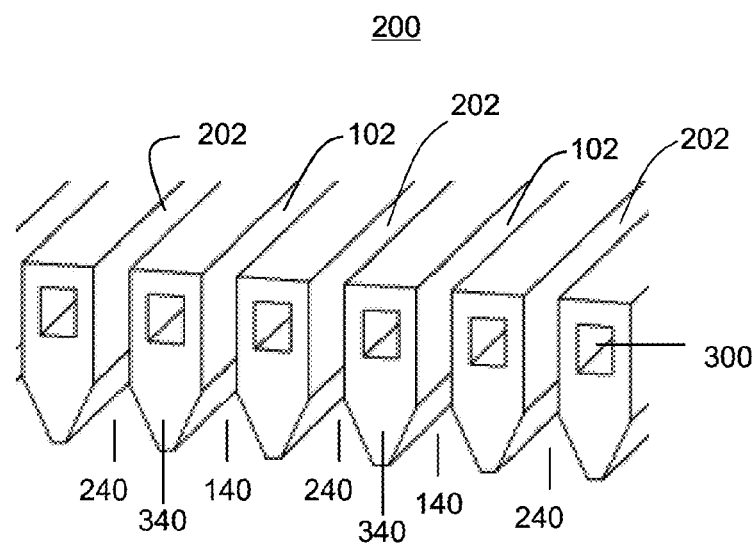
FIG. 8 is a schematic view showing the structure of another embodiment of the water cooling plate.

FIG. 8 is a schematic view showing the structure of another embodiment of the water cooling plate. As shown in FIG. 8, in order that the first reactant gas and the second reactant gas can be mixed sufficiently after entering the reaction zone 500, an area of a cross section 140 of the gas outlet groove is gradually increased at one end, adjacent to the workpieces 6 to be processed (as shown in FIG. 1), of the first gas outlet groove 102 as getting close to the workpieces 6 to be processed, so as to buffer the flow velocity of the gas in the first gas outlet groove 102, such that the first reactant gas and the second reactant gas may be diffused and mixed better. Similarly, an area of a cross section 240 of the gas outlet groove is also gradually increased at one end, adjacent to the workpieces 6 to be processed, of the second gas outlet groove 202 as getting close to the workpieces 6 to be processed. As the cross sectional areas of the two gas outlet grooves are increased gradually, a solid component 340 between the first gas outlet groove 201 and the second gas outlet groove 202 has a cross sectional area gradually decreased, for example the cross section of the solid component 340 forms a tapered or triangular shape, so as to reduce the solid area of the water cooling plate 200 close to the reaction zone 500, which may facilitate reducing the deposition generated by the reactant gas on the lower surface of the water cooling plate 200. Also, since the solid component 340 has a small solid area, the gases from the first gas outlet groove 102 and the second gas outlet groove 202 may be mixed and reacted with each other better. Preferably, the cross section of the solid component 340 has an inverted isosceles triangular shape or has a certain circular arc shape at the top end.

A cooling passage 300 filled with cooling liquid is arranged between the first gas outlet groove 102 and the second gas outlet groove 202 of the water cooling plate 200. Preferably, the cooling passage 300 is uniformly distributed at a middle position between the first gas outlet groove 102 and the second gas outlet groove 202. Preferably, the cooling passage 300 is parallel to the first gas outlet groove 102 and the second gas outlet groove 202. The cooling passage 300 may be arranged to be embedded in the water cooling plate 200 in a mechanical machining manner as shown in the figure, and may also be formed by digging a groove having a certain depth on the upper surface of the water cooling plate 200 by mechanical machining and then sealing the groove opening.

As an embodiment, steps for making the water cooling plate 200 include: making a flat plate 220 having a certain thickness, arranging several columns of cooling liquid passages 300 substantially parallel to the upper and lower surfaces of the flat plate inside the flat plate 220 uniformly, and arranging several columns of longitudinal first gas outlet grooves 102 and second gas outlet grooves 202 between two adjacent cooling liquid passages 300, and wherein the first gas outlet groove 102 and the second gas outlet groove 202 are respectively corresponding to the first gas diffusion passage 1 and the second gas diffusion passage 2 of the gas distribution and diffusion plate 100 in the vertical direction.

Figure 9:
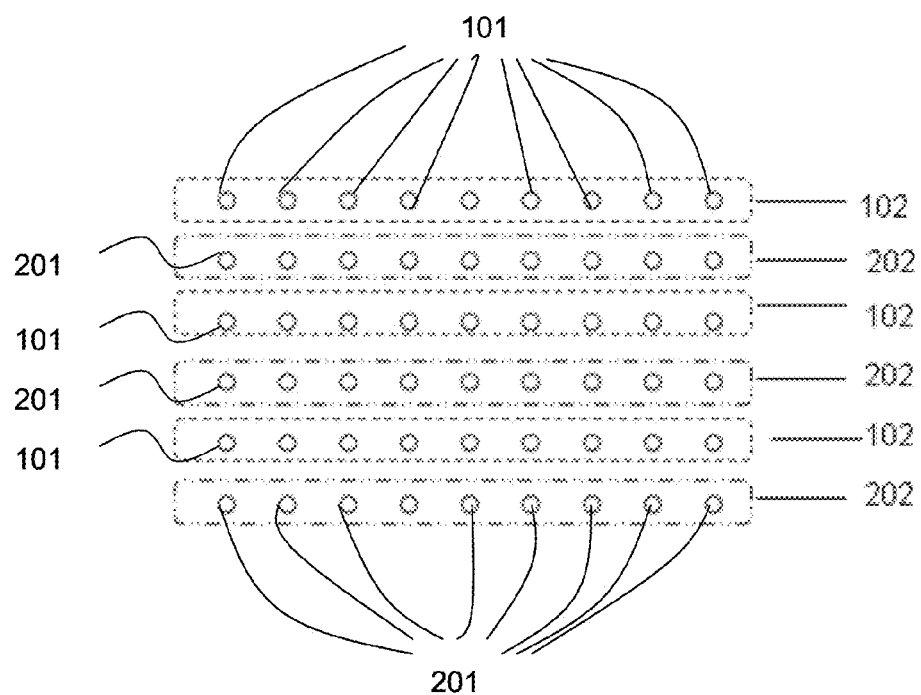
FIG. 9 is a schematic top view showing the structure of the gas showerhead according to the present application.

FIG. 9 is a schematic top view showing the structure of the gas showerhead according to the present application, which illustrates the connecting relationship between the several separated gas diffusion paths of the gas distribution and diffusion plate and the gas outlet grooves of the water cooling plate. As shown in the drawing, the dotted lines represent several columns of the first gas outlet grooves 102 and several columns of the second gas outlet grooves 202 alternately arranged in the water cooling plate 200, the several circles in each column of the first gas outlet grooves 102 represent several separated gas diffusion paths of the first gas diffusion passages 1, for example the conduits 101, and the several circles in each column of the second gas outlet grooves 202 represent several separated gas diffusion paths in the second gas diffusion passages 2, for example the conduits 201. The first reactant gas is uniformly diffused and distributed via the several separated gas diffusion paths (for example the conduits 101) in the first gas diffusion passages 1 and then is conveyed into the first gas outlet grooves 102 and then is conveyed into the reaction zone 500 (as shown in FIG. 1); the second reactant gas is uniformly diffused and distributed via the several separated gas diffusion paths (for example the conduits 201) in the second gas diffusion passages 2, and then is conveyed into the second gas outlet grooves 202 and then is conveyed into the reaction zone 500 (as shown in FIG. 1), and then the two reactant gases are mixed and are reacted with each other.

Compared to the prior art, the design in the present application has the following distinguished advantages. In the prior art, since the concentrations of the gases in the first reactant gas zone 10 and the second reactant gas zone 20 are difficult to be kept perfectly uniform, and if the reactant gases directly pass through the groove-shaped gas passages 102 and 202 and then enter the reaction zone 500, the concentration of the reactant gases in the reaction chamber may not be uniform, such that it is hard to process the workpieces 6 to be processed uniformly, thereby affecting the qualified rate of the product. In the present embodiment, a gas distribution and diffusion plate 100 is arranged above the water cooling plate 200, and several separated gas diffusion paths (for example, conduits, drilled holes having a certain thickness or other equivalent structures) are arranged on the gas distribution and diffusion plate 100 uniformly or nonuniformly but regularly, which is equivalent to arranging, above the water cooling plate 200, a gas showerhead enabling two kinds of reactant gases to be sufficiently diffused and distributed in advance. Therefore, unlike in the prior art that the gases directly enter the water cooling plate 200, in the present application the gases in the first reactant gas zone 10 and the second reactant gas zone 20 are sufficiently distributed and diffused in the gas distribution and diffusion plate 100, and then are conveyed into the water cooling plate 200, thereby improving the uniformity of the reactant gases in the reaction chamber, so as to improve the qualified rate of the workpieces to be processed.

Figure 10:
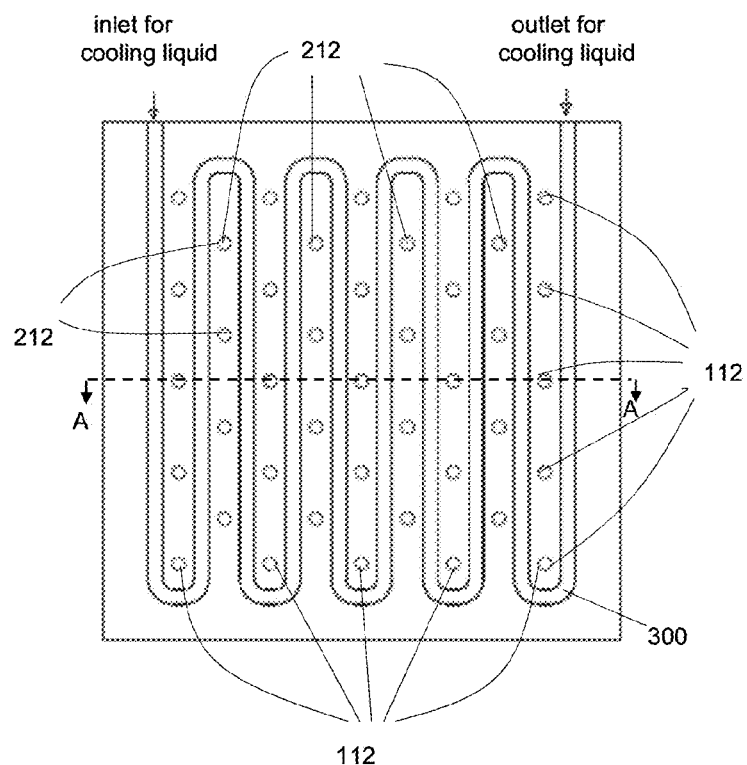
FIG. 10 is a schematic view showing the structure of another embodiment of the water cooling plate.
Figure 11:
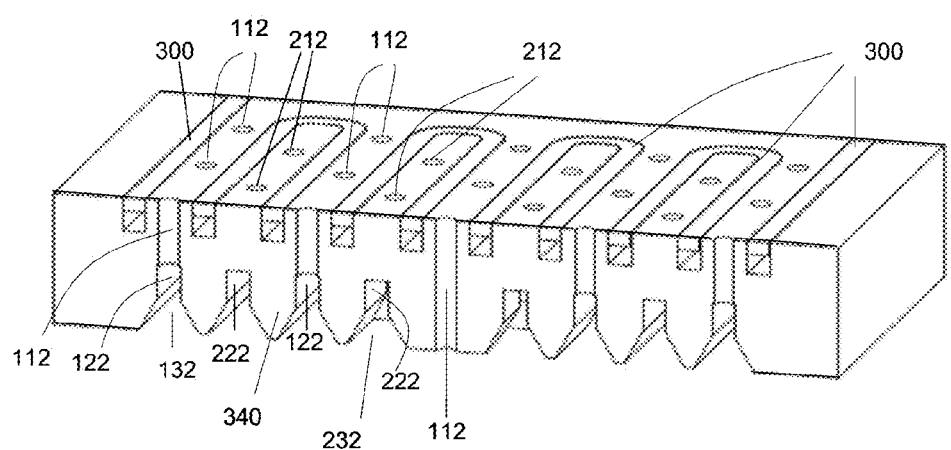
FIG. 11 is a sectional schematic view taken along line A-A in FIG. 10.

Another embodiment of the water cooling plate 200 according to the present application is shown in FIGS. 10 and 11. FIG. 10 is a top view of the water cooling plate according to the present embodiment, and FIG. 11 is a sectional schematic view taken along line A-A in FIG. 10. Specifically, several columns of cooling liquid passages 300 substantially parallel to the upper and lower surfaces of the flat plate 220 are uniformly arranged inside the flat plate 220 of the water cooling plate 200. The cooling liquid passages 300 may have a plurality of cooling liquid inlets and cooling liquid outlets, and may also of a structure having only one cooling liquid inlet and one cooling liquid outlet. Several holes 112 and 212 extending towards the lower surface of the water cooling plate 200 by a certain depth from the upper surface of the water cooling plate 200 are arranged between each two columns of the cooling liquid passages 300. The depths of the holes 112 and 212 are smaller than the depth of the water cooling plate 200. The holes 112 and the holes 212 are arranged by columns, and columns of the holes 112 and columns of the holes 212 are arranged alternately on the water cooling plate 200, and are correspondingly communicated with the first gas diffusion passages 1 and the second gas diffusion passages 2 of the gas distribution and diffusion plate 100. Several longitudinal gas outlet grooves 122 and 222 extending through the lower surface of the water cooling plate 200 are arranged at ends, close to the lower surface of the water cooling plate 200, of the holes 112 and 212. Specifically, a plurality of holes 112 and the gas outlet grooves 122 are communicated to form a first gas outlet passage of the water cooling plate 200. A plurality of holes 212 and the gas outlet grooves 222 are communicated to form a second gas outlet passage of the water cooling plate 200. The groove-shaped structure can increase the passage area of the reactant gases, and slow down the velocity of the gas flow, such that the reactant gases can be diffused and mixed better. Cross sectional areas of the gas outlet grooves 122 and 222 at ends, close to the workpieces 6 to be processed, of the longitudinal gas outlet grooves 122 and 222 increases gradually as getting close to the workpieces 6 to be processed, and a cross sectional area of the solid component 340 between the gas outlet groove 122 and the gas outlet groove 222 decreases gradually as getting close to the workpieces 6 to be processed, which may facilitate enlarging the area of the gas outlet passage, and may reduce the deposition generated by the reactant gas on the lower surface of the water cooling plate 200. Preferably, the cross section of the solid component 340 has an inverted isosceles triangular shape or has a certain circular arc shape at the top end.

Figure 12:
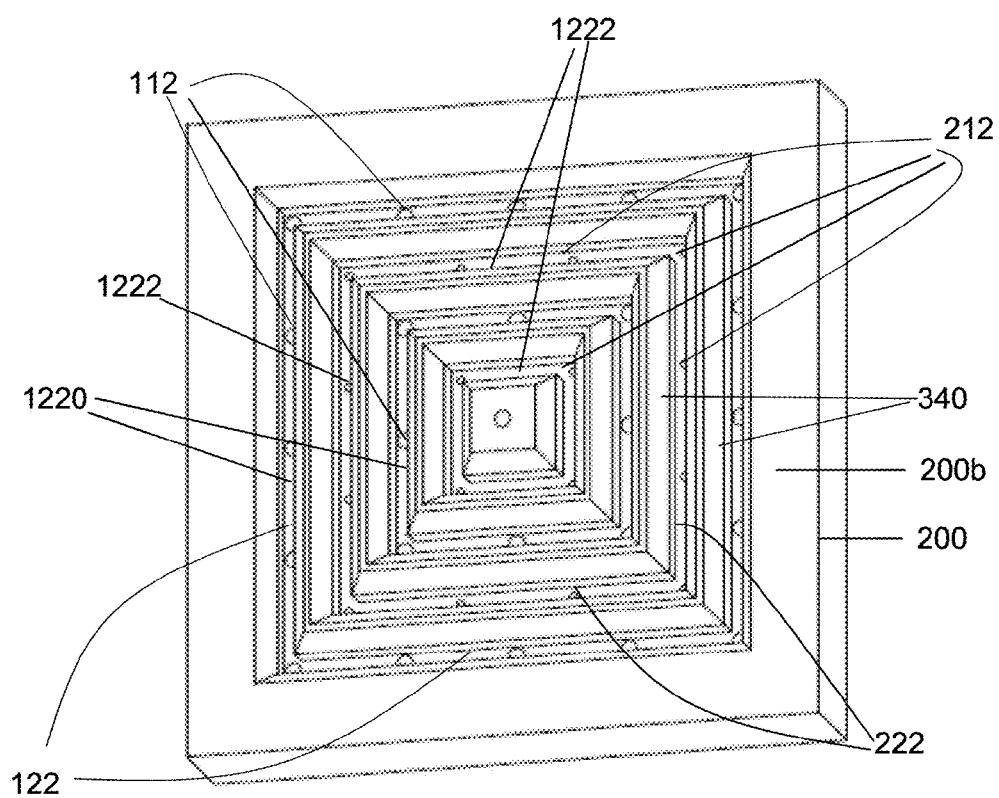
FIG. 12 is a bottom view of still another embodiment of the water cooling plate.

FIG. 12 is a bottom view of still another embodiment of the water cooling plate. The embodiment shown in FIG. 12 is different from the above embodiment in that several first gas outlet passages 1220 and several second gas outlet passages 1222 respectively constitute loop structures, each of which is intercommunicated. Specifically, several first gas outlet passages 1220 and several second gas outlet passages 1222 are arranged on the lower surface 220b of the water cooling plate 200. The several first gas outlet passages 1220 constitute first loop structures, each of which is intercommunicated; and the several second gas outlet passages 1222 constitute second loop structures, each of which is intercommunicated. In the embodiment shown in the drawing, each loop constitutes a quadrate communicated passage. The first loop structures and the second loop structures are arranged alternately, or nested within each other. A solid component 340 is provided between the first loop structure and the second loop structure. Similar to the arrangement in the above embodiment, an area of the solid component 340 between the first gas outlet passage 1220 and the second gas outlet passage 1222 decreases gradually, which may facilitate enlarging the area of the gas outlet passage, and may reduces the deposition generated by the reactant gases on the lower surface 34 of the water cooling plate 200. The first loop structure and the second loop structure may have various forms, such as a regular polygonal structure or a circular structure. In the drawing, these loops are indicated as square passages. As one embodiment, each of the first gas outlet passages 1220 and the second gas outlet passages 1222 is of a groove structure concaved inwards by a certain depth from the lower surface 220b till extending through the upper surface (not shown); and the solid components 340 between each two adjacent grooves, for example, the longitudinal grooves 122, 222, are connected by a connecting member (not shown). Furthermore, the first gas outlet passage 1220 and/or the second gas outlet passage 1222 may also be of a structure formed by a groove and a hole. For example, the water cooling plate 200 also includes an upper surface (not shown) opposite to the lower surface 220b, and several columns of holes 112 and 212, extending downwards by a certain depth from the upper surface till being communicated with the grooves 122 and 222, may also be arranged on the water cooling plate 200. These structures formed by holes and grooves are similar to the structures formed by holes 112 and grooves 122 as shown in FIG. 11. Similar to the above embodiment, the water cooling plate 200 is further provided with several cooling liquid passages (not shown). These cooling liquid passages may be grooves extending downwards by a certain depth from the upper surface of the water cooling plate 200, which are similar to the structure of the cooling liquid passage 300 shown in FIG. 11; these cooling liquid passages may also be of the embedded structure of the cooling liquid passage 300 shown in FIG. 8. The first reactant gas escapes from the lower surface 220b via several first gas outlet passages 1220, and the second reactant gas escapes from the lower surface 220b via several second gas outlet passages 1222, and then the two reactant gases are mixed and are reacted with each other. Compared with the above embodiment, in the embodiment shown in FIG. 12, the reactant gas in each loop passage is distributed more uniformly, and the contacting area of the two reactant gases after escaped is increased, such that the two reactant gases are diffused and mixed better, thereby realizing the utilization of the two reactant gases to the greatest extent, improving the efficiency, and saving the cost.

Figure 13:
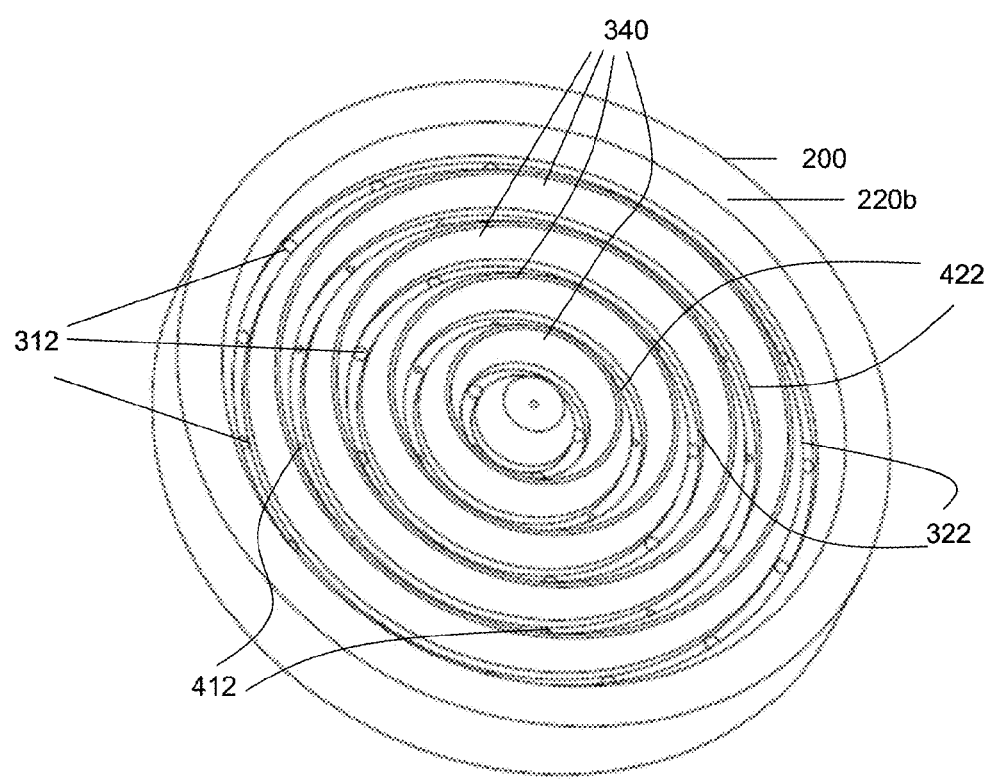
FIG. 13 is a bottom view of yet another embodiment of the water cooling plate.

FIG. 13 is a bottom view of yet another embodiment of the water cooling plate which is a modification of the embodiment shown in FIG. 12. In the embodiment shown in FIG. 13, several first gas outlet passages 322 and several second gas outlet passages 422 on the water cooling plate 200 are distributed alternately in concentric circles shape, and constitute first loop structures and second loop structures respectively. Similar to the above embodiment, the several first gas outlet passages 322 and the several second gas outlet passages 422 are of a groove structure having a certain depth and extending through the upper surface and the lower surface 220b of the water cooling plate 200, and the solid components 340 between each two adjacent grooves are connected by a connecting element (not shown). Or the several first gas outlet passages 322 and the several second gas outlet passages 422 are of a structure formed by a groove and a through hole, these through holes are indicated as holes 312 and 412 in the drawing and are communicated with the grooves. Through holes 312 and 412 are several columns of holes extending downwards by a certain depth from the upper surface of the water cooling plate 200 till being communicated with the grooves. The circular groove structure may furthest increase the contact area of the reactant gases, so as to diffuse and mix the reactant gases better. In order to enlarge the cross sectional area of the gas outlet passage of the concentric circular groove, the cross sectional area of the gas outlet passage at one end, close to the workpieces 6 to be processed, of the concentric circular grooves 322 and 422 is increased gradually as getting close to the workpieces 6 to be processed, and the cross sectional area of the solid component 340 between the concentric circular grooves 322 and 422 is decreased gradually as getting close to the workpieces 6 to be processed, which may facilitate enlarging the area of the gas outlet passage, and may reduces the deposition generated by the reactant gases on the lower surface 220b of the water cooling plate 200. Preferably, the cross section of the solid component 340 has an inverted isosceles triangular shape or has a certain circular arc shape at the top end.

In the prior art, the gas conveying plate in the gas showerhead and the water cooling plate are made integrally, therefore, it is difficult to manufacture, and if one piece of the gas conveying plate and the water cooling plat is failed, the whole gas showerhead may be scrapped, furthermore, it is difficult to clean the showerhead. Compared to the prior art, the water cooling plate 200 according to the present application is an independently manufactured component, and it is manufactured in mechanical machining manner, thus the manufacture is easy, the leakage of the cooling liquid is not easy to happen, thereby ensuring the gas in the gas outlet passages having a constant temperature and avoiding the disadvantageous impacts caused by the overheat of the reactant gas. Specifically, the gas distribution and diffusion plate 100 and the water cooling plate 200 in the present application are two separated components which can be detached, and these two components may be assembled integrally in a detachable mechanical method, which may facilitate the manufacture and reduce the cost, and further these two components can be detached after the using process is finished, which may facilitate the cleaning of the gas distribution and diffusion plate 100 and the water cooling plate 200, thereby improving the working efficiency and qualified rate.

Figure 14:
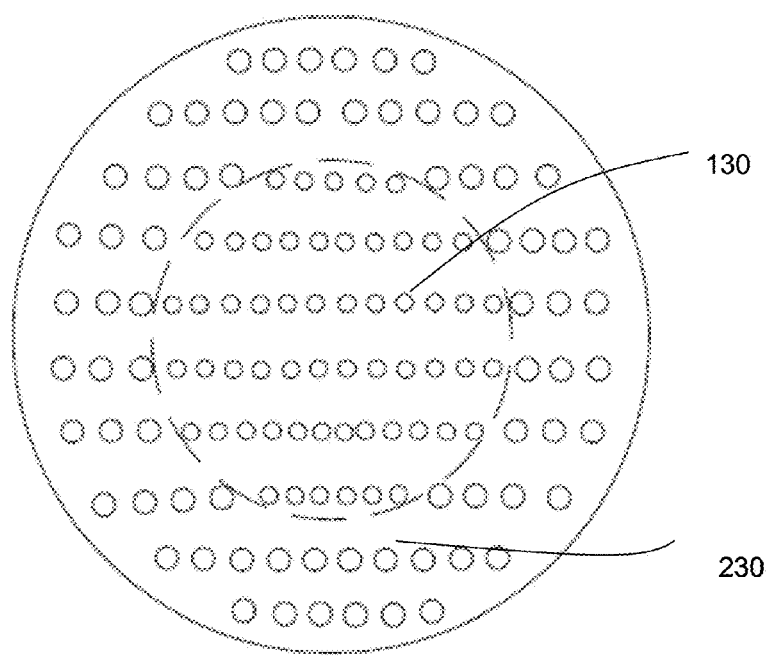
FIG. 14 is a schematic top view showing the structure of a partitioned gas distribution and diffusion plate.
Figure 15:
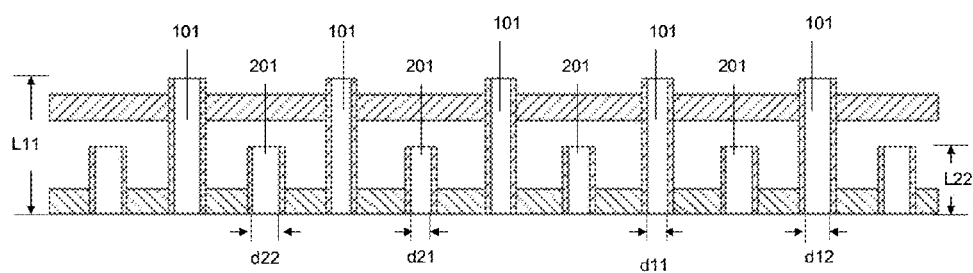
FIG. 15 is a proportional schematic view showing a length and an inner diameter of an intake pipe of the partitioned gas distribution and diffusion plate.

FIG. 14 is a schematic top view showing the structure of a partitioned gas distribution and diffusion plate, and FIG. 15 is a proportional schematic view showing a length and an inner diameter of an intake pipe of the partitioned gas distribution and diffusion plate. As shown in FIG. 14, in order to ensure the concentration of the reactant gases entering the reaction zone 500 to be more uniform, in the present embodiment, the gas distribution and diffusion plate 100 includes a first distribution zone 130 and the second distribution zone 230, and the first distribution zone 130 is close to a gas inlet of the reactant gas source (not shown). A distance between the second distribution zone 230 and the gas inlet of the reactant gas source is larger than a distance between the first distribution zone 130 and the gas inlet of the reactant gas source. Since the gas at a position close to the gas inlet of the reactant gas source has a higher concentration and a higher pressure, when entering the reactant zone 500 via the gas distribution and diffusion plate 100 and the water cooling plate 200, the gas at this position has a higher flow velocity, which is liable to cause the uneven distribution of the gas in the reaction zone 500. To solve the above problems, an inner diameter d11 of the conduit of the first gas diffusion passage A in the first distribution zone 130 is smaller than an inner diameter d12 of the corresponding conduit of the first gas diffusion passage A in the second distribution zone 230; and an inner diameter d21 of the conduit of the second gas diffusion passage B is smaller than an inner diameter d22 of the corresponding conduit of the second gas diffusion passage B in the second distribution zone 230. The feeding amount of the reactant gas is decreased by reducing the inner diameter of the conduit, such that the concentrations of the gases conveyed into the water cooling plate 200 from the first distribution zone 130 and the second distribution zone 230 are same. Since the pressure drop of the reactant gas has a certain proportional relationship with the length and the inner diameter of the intake pipe, and the proportional relationship is that $\Delta P$ is directly proportional to $L/d^3$. In order to facilitate determining the dimension of the inner diameters of the intake pipes in the first distribution area 130 and the second distribution area 230, in the present embodiment, the conduits of the first gas diffusion passage 1 have the same length L11 of 50 mm, and the conduits of the second gas diffusion passage 2 have the same length L22 of 18 mm. The other technical features are the same as those in the first embodiment.

Figure 16:
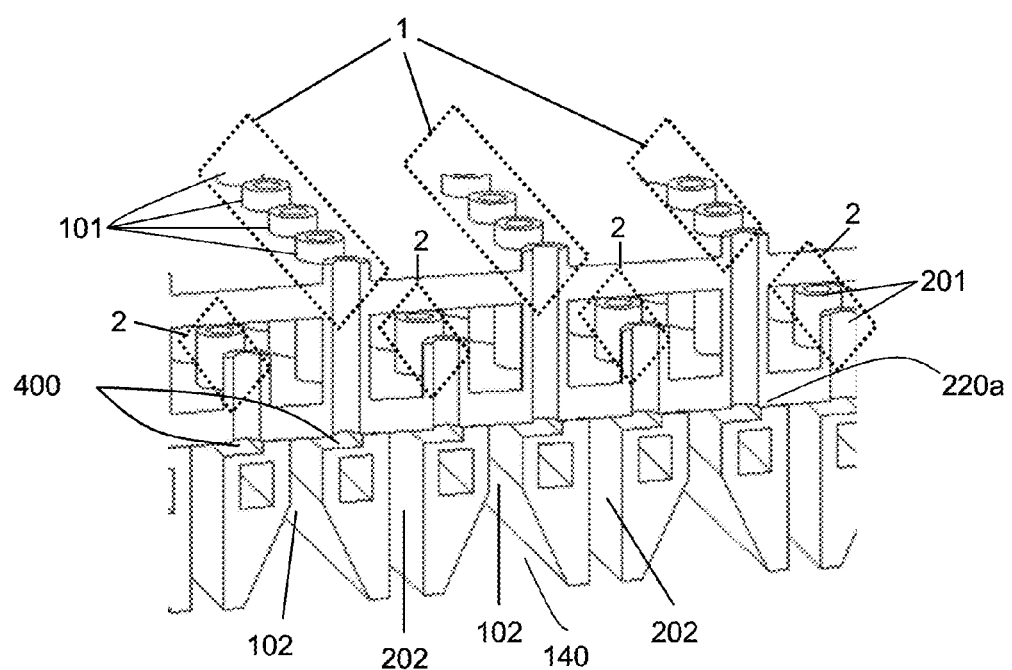
FIG. 16 is a schematic view showing the structure of a gas showerhead having gas buffering openings.

As shown in FIG. 16, in order to moderate the flow velocity of the reactant gases entering the reaction zone 500 so as to diffuse and mix the reactant gases better, in the present embodiment, several gas buffering openings 400 are arranged from groove openings at ends, close to the gas distribution and diffusion plate 100, of the first gas outlet passages 102 and the second gas outlet passages 202 to the upper surface 220a of the water cooling plate 200. Each gas buffering opening 400 is at least partially communicated with one first gas outlet passage 102 or one second gas outlet passage 202. Each gas diffusion passage and the corresponding gas outlet passage are staggered by a certain distance in the vertical direction, thus the gas diffusion passage and the corresponding gas outlet passage are not communicated directly but are intercommunicated via the gas buffering opening 400. The gas buffering opening 400 is preferably of a stepped shape, and may also of a slope shape, or a circular arc shape, or other irregular shapes capable of buffering the gas flow. The gas buffering opening 400 of stepped shape may have one step or a plurality of steps, and each step has a small thickness, and the step close to the gas distribution and diffusion plate 100 is located at a position corresponding to the outlet of the first gas diffusion passage 1 or the second gas diffusion passage 2. The gas flowing out of the first gas diffusion passage 1 and the gas flowing out of the second gas diffusion passage 2 respectively enter the first gas outlet passages 102 and the second gas outlet passages 202 after being buffered by passing through the gas buffering openings 400, and then, via the cross sections 140, having a gradually increased area and close to the workpieces 6 to be processed, of the first gas outlet passages 102 and the second gas outlet passages 202, slowly flow out of the first gas outlet passages 102 and the second gas outlet passages B respectively to be sufficiently mixed and to react with each other. Other technical features are the same as the above embodiments. It should be appreciated that, the above several gas buffering openings 400 may be partially arranged or selectively arranged according to the actual requirements, for example, the gas buffering openings 400 may be arranged only at outlets of the first gas outlet passages 102, so as to only control the gas outlet velocity of the first reactant gas; and the gas buffering openings 400 may be arranged only at outlets of the second gas outlet passages 202, so as to only control the gas outlet velocity of the second reactant gas. Also, the whole gas showerhead may be divided into a central zone and an edge zone, or be divided into more zones, and the gas buffer opening 400 may be selectively arranged near the second gas outlet grooves corresponding to some zones so as to partially adjust the gas outlet velocity of the reactant gas in these zones.

It should be appreciated that, in the present application, the first reactant gas is not limited to only one reactant gas, and may also be a mixed substance of some gases; and so does the second reactant gas.

The gas showerhead according to the present application may be adapted to any thin film growth reactors, and may be particularly adapted to the thin film growth reactor for metal organic compound.

Based on the above description, compared to the prior art, the present application has various advantages as follows.

(1) In the present application, a gas distribution and diffusion plate 100 is arranged above a water cooling plate 200, and several separated gas diffusion paths (for example, conduits, drill holes, or deep holes having a certain depth) are arranged on the gas distribution and diffusion plate 100 uniformly or nonuniformly but regularly, which is equivalent to arranging, above the water cooling plate 200, a gas showerhead enabling two kinds of reactant gases to be sufficiently diffused and distributed in advance. Therefore, the gases in the first reactant gas zone and the second reactant gas zone are sufficiently distributed and diffused in the gas distribution and diffusion plate 100, and then are conveyed into the water cooling plate 200, thereby improving the uniformity of the reactant gases in the reaction chamber, so as to improve the qualified rate of the workpieces to be processed.

(2) In the present application, the first gas outlet passages and the second gas outlet passages of the water cooling plate are configured to furthest reduce the solid area of the lower surface of the gas showerhead, such that the deposition of impurities on the lower surface can be reduced to the greatest extent, and also the two reactant gases can be mixed sufficiently, which may reduce the waste of gases.

(3) According to the present application, the gas diffusion plate and the water cooling plate are made separately, such that the difficulty of the manufacture is reduced, and the reactant gases can be diffused in the state of being isolated from each other, meanwhile the leakage of the cooling liquid in the cooling liquid passage can be prevented. Further, the gas distribution and diffusion plate 100 and the water cooling plate 200 are assembled in a detachable mechanical manner, such that the gas distribution and diffusion plate 100 and the water cooling plate 200 can be cleaned or replaced independently, thereby reducing the cost and improving the efficiency.

(4) Preferably, at least one group of the gas outlet passages are provided with a gas buffering opening of stepped shape and/or a cross section having gradually increased area, such that the reactant gas of relatively higher flow velocity can flow into the reactor at a relatively smaller flow velocity so as to facilitate the sufficient mixing of the reactant gases, thereby improving the utilization efficiency of the reactant gases and the qualified rate of the workpieces to be processed.

The present application is illustrated hereinabove by preferred embodiments; however these preferred embodiments are not intended to limit the application. For the person skilled in the art, possible variations and modifications may be made to the present application without departing from the spirit and scope of the present application, and the protection scope of the present application is defined by the claims.

The invention claimed is:

1. A gas showerhead, for isolatedly feeding at least a first reactant gas and a second reactant gas into a reaction chamber, comprising:

a gas distribution and diffusion plate, comprising a plurality of rows of first gas diffusion passages connecting to a first reactant gas source and a plurality of rows of second gas diffusion passages connecting to a second reactant gas source, the plurality of rows of the first gas diffusion passages and the plurality of rows of the second gas diffusion passages are arranged alternately; and a water cooling plate, located below the gas distribution and diffusion plate, comprising a cooling liquid passage comprising a plurality of columns of cooling liquid passages, a plurality of first gas outlet passages provided for a reactant gas in the first gas diffusion passages to flow out, a plurality of second gas outlet passages provided for a reactant gas in the second gas diffusion passages to flow out, and the plurality of first gas outlet passages are arranged alternately with the plurality of second gas outlet passages;

wherein the gas distribution and diffusion plate and the water cooling plate are two separated components and are assembled integrally in a detachable mechanical manner, and the first reactant gas and the second reactant gas are isolated from each other before exiting the gas showerhead and entering the reaction chamber;

wherein the gas distribution and diffusion plate comprises an upper plate and a lower plate, the first gas diffusion passages comprise a plurality of first conduits extending through the upper plate and the lower plate, wherein the second gas diffusion passages comprise a plurality of second conduits extending through the lower plate, and wherein an upper opening of each of the second conduits is lower than a bottom surface of the upper plate but is higher than an upper surface of the lower plate;

wherein the water cooling plate comprises flat upper surfaces and flat lower surfaces, each of the plurality of first gas outlet passages and the plurality of second gas outlet passages comprises a continuous longitudinal groove extending through the flat upper surfaces and the flat lower surfaces of the water cooling plate, and a column of the plurality of columns of cooling liquid passages is disposed between each of the plurality of first gas outlet passages alternately arranged with each of the plurality of second gas outlet passages; and wherein a cross section of each of the plurality of first conduits and the plurality of second conduits in a horizontal direction is circular and opens to one of the continuous longitudinal grooves of the plurality of first gas outlet passages and the plurality of second gas outlet passages such that reactant gas is conveyed first through first and second conduits and then diffused and distributed via the continuous longitudinal grooves.

2. The gas showerhead according to claim 1, wherein an upper conduit opening of each of the plurality of first conduits is higher than an upper surface of the upper plate.

3. The gas showerhead according to claim 1, wherein the plurality of first gas outlet passages comprise first loop structures, and the plurality of second gas outlet passages comprise second loop structures, and the first loop structures and the second loop structures are arranged alternately, or nested within each other.

4. The gas showerhead according to claim 3, wherein the first loop structure and the second loop structure both are of a regular polygonal structure or a circular structure.

5. The gas showerhead according to claim 1 wherein for each of the continuous longitudinal grooves of the plurality of first gas outlet passages and the plurality of second gas outlet passages comprise a cross sectional area that gradually increases in a direction from the flat upper surfaces toward the flat lower surfaces of the water cooling plate.

6. The gas showerhead according to claim 1, wherein a plurality of gas buffering openings are selectively arranged on at the flat upper surfaces of the water cooling plate, the plurality of gas buffering openings communicate with at least part of the continuous longitudinal grooves of the plurality of the first gas outlet passages or at least part of the continuous longitudinal grooves of the plurality of the second gas outlet passages.

7. The gas showerhead according to claim 6, wherein the plurality of gas buffering openings comprise a stepped shape, or a slope shape, or a circular arc shape.

8. The gas showerhead according to claim 1, wherein the plurality of first conduits and plurality of second conduits are distributed on the gas distribution and diffusion plate uniformly or nonuniformly but regularly.

9. The gas showerhead according to claim 1, wherein the gas distribution and diffusion plate comprises a first distribution zone and a second distribution zone, the first distribution zone is close to a gas inlet of a first reactant gas source, and a distance between the second distribution zone and the gas inlet of the first reactant gas source is larger than a distance between the first distribution zone and the gas inlet of the first reactant gas source; an inner diameter of the first gas diffusion passage in the first distribution zone is smaller than an inner diameter of the corresponding first gas diffusion passage in the second distribution zone, and an inner diameter of the second gas diffusion passage in the first distribution zone is smaller than an inner diameter of the corresponding second gas diffusion passage in the second distribution zone.

* * * * *